United States Patent [19]

Rhee et al.

[11] 3,959,727

[45] May 25, 1976

[54] TELEVISION RECEIVER REMOTE CONTROL

[75] Inventors: Dong Woo Rhee, Wheeling, Ill.; David Lee Funston, Batavia, N.Y.

[73] Assignee: GTE Sylvania Incorporated, Stamford, Conn.

[22] Filed: Oct. 3, 1974

[21] Appl. No.: 511,596

[52] U.S. Cl. ................................ 325/390; 325/468; 334/15

[51] Int. Cl.$^{2}$ ........................................... H04B 1/06

[58] Field of Search ........... 178/DIG. 15; 334/8–10, 334/15; 325/468–471, 390–392, 332, 335, 393; 307/251, 304, 238; 340/171; 343/225

[56] References Cited

UNITED STATES PATENTS

| | | | |
|---|---|---|---|
| 3,571,620 | 3/1971 | Hansen et al. | 325/391 X |
| 3,575,661 | 4/1971 | Slavik | 325/390 |
| 3,631,349 | 12/1971 | Rhee | 325/470 |
| 3,713,028 | 1/1973 | Boyd et al. | 325/392 |
| 3,757,228 | 9/1973 | Klank | 325/470 |

*Primary Examiner*—Robert L. Griffin
*Assistant Examiner*—Robert Hearn
*Attorney, Agent, or Firm*—Norman J. O'Malley; Robert E. Walrath; Robert T. Orner

[57] ABSTRACT

A remote control receiver for a television receiver remote control system having a memory capacitor and a field-effect transistor readout to provide a direct control voltage is shown. Circuit means illustrated as a diode connected in series with the memory capacitor limits the magnitude of the charge stored by the memory capacitor to prevent the field-effect transistor from being driven beyond cut-off by an excessive amount.

2 Claims, 1 Drawing Figure

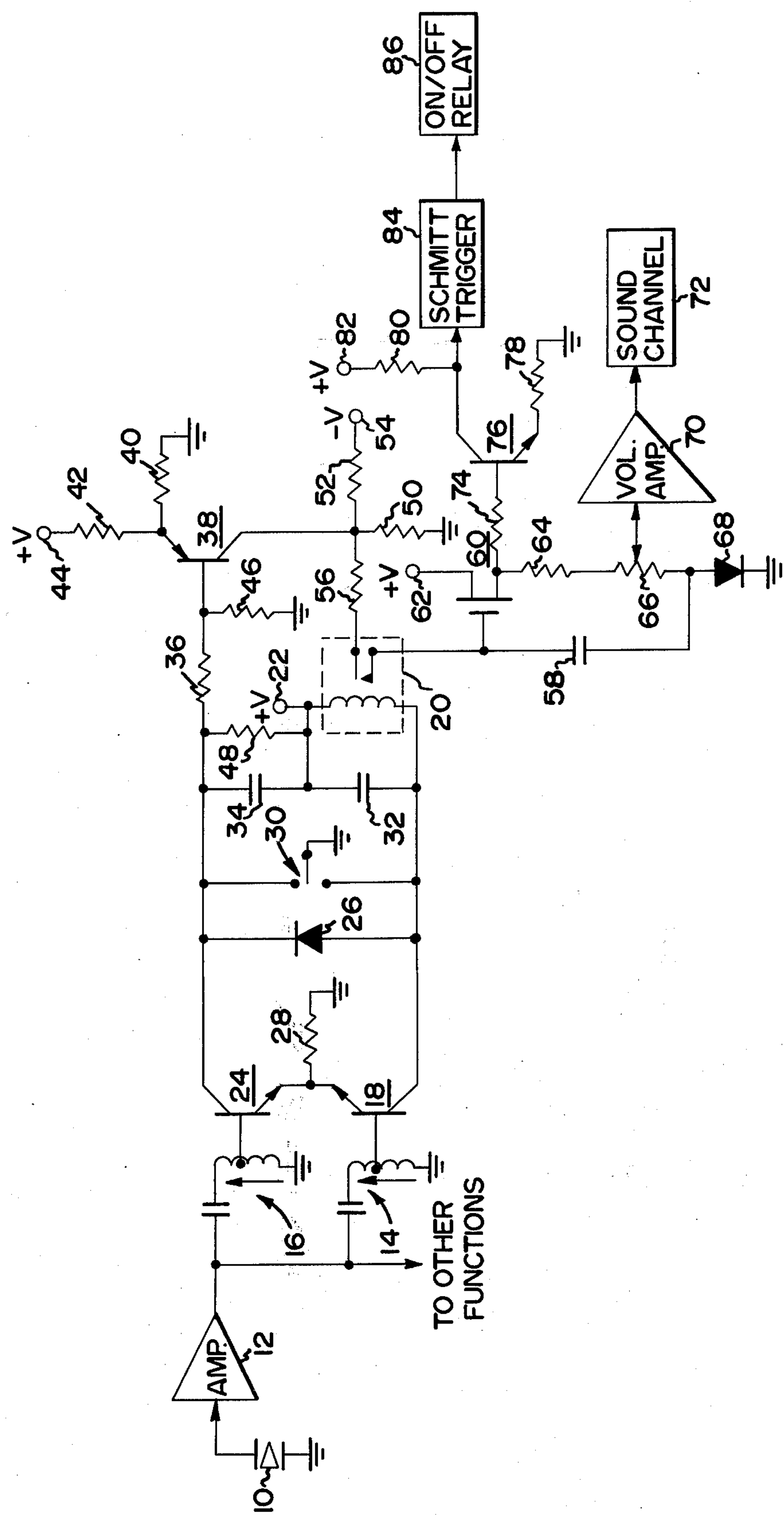
ON/OFF RELAY
86
SCHMITT TRIGGER
84
SOUND CHANNEL
72
VOL. AMP.
70
AMP.
12
TO OTHER FUNCTIONS
+V
44
42
40
38
46
36
+V
22
48
34
30
32
26
28
24
18
16
14
10
20
-V
54
52
50
56
+V
62
60
58
74
76
78
+V
82
80
64
66
68

TELEVISION RECEIVER REMOTE CONTROL

BACKGROUND OF THE INVENTION

This invention relates to remote control systems for television receivers and more specifically to remote control systems having a charge storage means and means for sampling the charge to effect a control function.

Remote control systems for television receivers typically include a remote ultrasonic transmitter for transmitting a plurality of ultrasonic signals of different frequencies and an ultrasonic receiver. The ultrasonic receiver typically includes a plurality of frequency discriminators or detectors each for detecting one of the plurality of transmitted signals. A control function is associated with each of the ultrasonic detectors and is initiated upon receipt of the corresponding signal. While prior are remote control systems typically included bi-directional motors mechanically coupled to a potentiometer or similar device, and such systems utilizing motors are still advantageously used in some applications, a preferred form of remote control system includes a circuit which stores a charge and provides a direct control voltage to a variable gain amplifier or the like. One such system is disclosed in U.S. Pat. No. 3,637,922 issued to G. K. Srivastava wherein first and second resonant circuits provide output signals to fire a neon bulb which charges and discharges, respectively, a memory capacitor. The charge on the memory capacitor is sampled by a field-effect transistor to provide a direct control voltge to control a phase shift circuit used as a tint control in a color television receiver. The direct control voltage can also be used to control other functions as well as tint. Also, it is known to use a relay circuit to charge and discharge the memory capacitor instead of a neon bulb.

In order for a television receiver to be fully controlled by a remote transmitter, it is necessary for the remote control system to be powered at all times including times when the television receiver is off so that the television receiver can be turned on by the remote transmitter. It has been found, however, that in one prior art arrangement when the television receiver was off for an extended period, the charge on the memory capacitor undesirably changed in a direction to drive the field-effect transistor far beyond cut-off so that a remote transmission of a substantial length of time was required to return the charge on the memory capacitor to the proper operating point. For example, in a circuit to control the volume and on/off functions, a substantial length of time was required to turn the television receiver on. It was further found that the cause of the undesired discharging of the memory capacitor was extraneous ultrasonic noise which energized the remote control receiver to fire the neon bulb or close the relay momentarily. Such momentary charging periods when repeated over a period of time caused a substantial undesired discharging of the memory capacitor.

In other instances an operator may inadvertently or in some cases intentionally continue the remote transmission beyond the time necessary to accomplish the desired function. For example, where the volume and on/off functions are combined, a remote transmission that decreases the volume until the television receiver turns off may be continued so that the memory capacitor associated with those functions becomes undesirably charged requiring an excessively long transmission to turn the television receiver on again.

OBJECTS AND SUMMARY OF THE INVENTION

Accordingly, it is an object of this invention to provide a new and novel remote control system which obviates the above-noted and other disadvantges of the prior art.

It is a further object of this invention to provide a remote control system wherein undesired charging of a memory capacitor is prevented.

In one aspect of this invention the above and other objects and advantages are achieved in a remote control receiver for a television receiver having charge storage means, means for charging the charge storage means, means for sampling the charge stored by the charge storage means, and limiting means connected in series with the charge storage means for limiting the magnitude of the charge stored by the charge storage means.

BRIEF DESCRIPTION OF THE DRAWING

The single FIGURE is a schematic illustration of one embodiment of a remote control receiver in accordance with the invention.

DETAILED DESCRIPTION OF THE PREFERRED EMBODIMENT

For a better understanding of the present invention, together with other and further objects, advantages and capabilities thereof, reference is made to the following disclosure in conjunction with the accompanying drawings.

In the FIGURE an ultrasonic transducer 10 receives transmitted ultrasonic signals and couples them to an amplifier 12. Amplifier 12 provides an output signal to a plurality of frequency detector circuits each associated with a remotely controlled function of the television receiver. Two frequency detector circuits are illustrated as resonant circuits 14 and 16 tuned to respective ones of the plurality of ultrasonic signals. In the specific embodiment resonant circuit 14 is tuned to the ultrasonic signal corresponding to the volume down and receiver off functions while resonant circuit 16 is turned to the ultrasonic signal corresponding to the receiver on and volume up functions.

The output of resonant circuit 14 is connected to a base of a transistor 18 which has a collector connected to one end of a winding of a relay 20, the other end of which is connected to a source of energizing voltage illustrated as a terminal 22. The output of resonant circuit 16 is connected to a base of a transistor 24 which has a collector connected by a reverse poled diode 26 to the junction of the collector of transistor 18 and the winding of relay 20. The emitters of transistors 18 and 24 are connected by a resistor 28 to a common conductor illustrated as circuit ground. A manually operable switch illustrated as a single pole, double throw switch 30 has stationary contacts connected to the collectors of transistor 18 and 24 and a movable contact connected to a circuit ground. A transient suppression capacitor 32 is connected in parallel with the winding of relay 20. Another transient suppression capacitor 34 is connected from source 22 to the collector of transistor 24.

The collector of transistor 24 is further connected by a resistor 36 to a base of a transistor 38 illustrated as a PNP transistor. An emitter of transistor 38 is connected by a resistor 40 to circuit ground and by a resistor 42 to a source of energizing voltage illustrated as a terminal 44. A resistor 46 is connected from the base of transistor 38 to circuit ground. A resistor 48 is connected from source 22 to the junction of the collector of transistor 24 and resistor 36. A collector of transistor 38 is connected by a resistor 50 to circuit ground, by a resistor 52 to a source of energizing voltage illustrated as terminal 54 and by a resistor 56 to one contact of relay 20.

The other contact of relay 20 is connected to one side of a charge storage means illustrated as a memory or charge storage capacitor 58 and to an input of a sampling means illustrated as a gate of a field-effect transistor (FET) 60 having an insulated gate for sampling the charge stored by capacitor 58. A drain of FET 60 is connected to a source of energizing voltage illustrated as a terminal 62. A source of FET 60 is connected by a resistor 64 in series with a resistance element of a potentiometer 66 to the other side of capacitor 58 to effectively connect capacitor 58 between the gate and source of FET 60. The junction between capacitor 58 and the resistive element of potentiometer 66 is connected by a limiting means illustrated as a diode 68 to circuit ground so that diode 68 is in series with capacitor 58.

A tap of potentiometer 66 is connected to an input of a volume control amplifier 70 which has an output connected to the sound channel 72 of the television receiver for controlling the volume of the sound produced by the television receiver. The source of FET 60 is further connected by a resistor 74 to a base of a transistor 76 which has an emitter connected by a resistor 78 to circuit ground and a collector connected by a resistor 80 to a source of energizing voltge illustrated as a terminal 82. The collector of transistor 76 is further connected to an input of a Schmitt trigger 84 which has an output connected to an on/off relay 86 for turning the television receiver on and off.

In operation the received ultrasonic signal is coupled from amplifier 12 to frequency detectors 14 and 16. When the received ultrasonic signal is of a first frequency corresponding to volume down, frequency detector 14 causes transistor 18 to turn on thereby completing a current path from source 22 through the winding of relay 20 to close the contacts of relay 20. Source 22 holds transistor 38 off so that the negative voltage of source 54 is coupled through resistors 52 and 56 and the contacts of relay 20 to charge capacitor 58 in a first direction which for the purposes of this specification is defined as discharging capacitor 58. The discharging current path is from the source of FET 60 through resistor 64 and the resistive element of potentiometer 66. When capacitor 58 discharges sufficiently to cut FET 60 off, diode 68 becomes reverse biased thereby preventing any further discharge of capacitor 58 beyond the cutoff point of FET 60. Volume control amplifier 70 is arranged so that it will not supply current to discharge FET 60.

When an ultrasonic signal is received of the frequency to which frequency detector 16 is tuned corresponding to volume up, transistor 24 is turned on to complete a current path from source 22 through the winding of relay 20 and diode 26 to close the contacts of relay 20. Transistor 24, however, also lowers the voltage at the base of transistor 38 to turn transistor 38 on. Resistors 40 and 42 comprise a voltage divider which couples a positive voltage to the emitter of transistor 38 which, when transistor 38 is on, is coupled to the junction of resistors 52 and 56 thereby coupling a positive voltage via the contacts of relay 20 to charge capacitor 58. Accordingly, the components numbered 10 through 56 comprise a charging means for charging capacitor 58 to the desired operating point. Those skilled in the art will realize that a charging means using a neon bulb similar to that disclosed in U.S. Pat. No. 3,637,922 can be used as well. Switch 30 provides a means for manually energizing relay 20 and turning transistor 38 on to either charge or discharge capacitor 58.

Capacitor 58 controls the operating point of FET 60. FET 60 is preferably an insulated gate FET so that once the desired operating point is established, the charge in capacitor 58 remains constant or substantially constant for extended periods of time. Current flow from source 62 through FET 60, resistor 64, and the resistive element of potentiometer 66 establishes a direct control voltage at the tap of potentiometer 66 which is coupled by a volume control amplifier 70 to the sound channel 72. Sound channel 72 includes a variable gain stage or a similar circuit responsive to the direct control voltage to vary the sound amplitude in response to the direct control voltage from amplifier 70.

The voltage at the source of FET 60 is also coupled to the base of transistor 76. At a predetermined voltage level at the source of FET 60, Schmitt trigger 84 switches to turn the television receiver on via relay 86. As capacitor 58 discharges the voltge at the source of FET 60 also decreases, and at a predetermined voltage less than the turn on voltage, Schmitt trigger 84 switches in the opposite direction to turn the television receiver off via relay 86.

As was noted above, extraneous ultrasonic signals or noise can cause frequency detectors 14 and 16 to turn transistors 18 and 24 on thereby undesirably varying the charge on capacitor 58. In one prior art arrangement, it was found that capacitor 58 was discharged such that an extended ultrasonic transmission was required to sufficiently charge capacitor 58 to cause FET 60 to become conductive and turn the television receiver on. Diode 68 prevents such undesired discharging of capacitor 58 by becoming reversed biased when FET 60 is cut-off.

Accordingly, a novel remote control system has been illustrated and described. A remote control system in accordance with the invention provides numerous advantages over the prior art generally outlined above. While a specific embodiment has been illustrated and described in connection with the volume and on/off functions and which a specific means for charging and discharging the charge storage means, those skilled in the art will realize that the invention is usable with other remotely controlled functions and charging means as well.

While there has been shown and described what is at present considered the preferred embodiment of the invention it will be obvious to those skilled in the art that various changes and modifications may be made therein without departing from the invention as defined by the appended claims.

We claim as our invention:

1. A remote control receiver for a television receiver comprising:

first and second frequency detectors;

first and second voltage sources of first and second polarities, respectively;

a capacitor for storing a charge representative of a desired operating point;

a relay with a winding, a first contact connected to said capacitor, and a second contact connected to said first voltage source of said first polarity;

a transistor connected to said second voltage source of said second polarity and to said second contact of said relay for connecting said second voltage source to said second contact;

means connecting said first and second frequency detectors to said winding for closing said first and second contacts in response to signals from either of said first and second frequency detectors and connecting said second frequency detector to said transistor for reversing the polarity of the voltage at said second contact in response to a signal from said second frequency detector for charging and discharging said capacitor;

a field-effect transistor having gate and source electrodes with said capacitor effectively connected between said gate and source electrodes for sampling the charge stored by said capacitor; and a diode connected in series with said capacitor for limiting the potential of said gate electrode during one of the charging and discharging operations for preventing said field-effect transistor from being driven beyond cut-off.

2. A remote control receiver for a television receiver comprising:

first and second frequency detectors;

first and second voltage sources of first and second polarities, respectively, with respect to circuit ground;

a capacitor for storing a charge representative of a desired operating point;

charging means connected to said first and second frequency detectors, to said first and second voltage sources, and to said capacitor for charging and discharging said capacitor by selectively connecting said first and second voltage sources to said capacitor in response to respective signals from said first and second frequency detectors;

a field-effect transistor having gate and source electrodes with said capacitor effectively connected therebetween; and a diode connected between said capacitor and circuit ground for limiting the potential of said gate electrode by preventing discharge of said capacitor beyond circuit ground potential for preventing said field-effect transistor from being driven beyond cut-off.

* * * * *